(12) United States Patent
Yoo

(10) Patent No.: US 6,897,162 B2
(45) Date of Patent: May 24, 2005

(54) INTEGRATED ASHING AND IMPLANT ANNEALING METHOD

(75) Inventor: Woo Sik Yoo, Palo Alto, CA (US)

(73) Assignee: WaferMasters, Inc., San Jose, CA (US)

( * ) Notice: Subject to any disclaimer, the term of this patent is extended or adjusted under 35 U.S.C. 154(b) by 0 days.

(21) Appl. No.: 10/690,315

(22) Filed: Oct. 20, 2003

(65) Prior Publication Data

US 2005/0085093 A1 Apr. 21, 2005

(51) Int. Cl.$^7$ .................. H01L 21/31; H01L 21/469
(52) U.S. Cl. .................. 438/770; 134/1.3; 430/329; 438/725; 438/780; 438/781
(58) Field of Search .................. 134/1.3, 26; 430/329; 438/509, 530, 539, 708, 725, 770, 776, 778, 780, 781

(56) References Cited

U.S. PATENT DOCUMENTS

| | | | | |
|---|---|---|---|---|
| 5,503,964 A | * | 4/1996 | Nishina et al. | 438/514 |
| 6,043,004 A | * | 3/2000 | Kurimoto | 430/329 |
| 6,231,775 B1 | * | 5/2001 | Levenson et al. | 216/67 |
| 6,410,455 B1 | * | 6/2002 | Kuribayashi et al. | 438/758 |
| 6,599,438 B2 | * | 7/2003 | Levenson et al. | 216/67 |
| 6,616,773 B1 | * | 9/2003 | Kuzumoto et al. | 134/26 |

OTHER PUBLICATIONS

Sang – Hun et al., "Application of Atmospheric Torch Plasma to Resist and Polymer Removals", Proceedings of the Symposium on Dry process, pp. 103–108, Nov (2000), Tokyo.*

* cited by examiner

*Primary Examiner*—Asok Kumar Sarkar
(74) *Attorney, Agent, or Firm*—MacPherson Kwok Chen & Heid LLP; Tom Chen

(57) ABSTRACT

After ion implantation, thermal ashing is conducted in a high oxygen concentration at a pressure of between about 100 to about 760 Torr at below 700° C. to remove the resist. Since photoresist consists of Carbon (C), Hydrogen (H) and Oxygen (O), the products of reaction of the thermal oxidation of the photoresist include $CO_2$ and $H_2O$. Since the process includes a substantial amount of oxygen, the resist can be completely oxidized, thus leaving no residue or other contaminates to remain on the substrate.

18 Claims, 4 Drawing Sheets

INTEGRATED ASHING AND IMPLANT ANNEALING METHOD

BACKGROUND

1. Field of Invention

This invention generally relates to semiconductor manufacturing methods and, more particularly, to a method for removing organic films and materials used during semiconductor wafer fabrication.

2. Related Art

New processing and manufacturing techniques are continuously being developed to make further advancements in the development of semiconductor devices, especially semiconductor devices of decreased dimensions.

An important aspect of the semiconductor device fabrication process is the removal of the photoresist film. As the size of semiconductor devices continues to decrease, typical photoresist removal methods must be able to increase the rate of residual-free resist removal, and must decrease the amount of damage caused in the substrate layers underlying the resist film.

Typically two types of ashing methods exist—a wet method and a dry method. The wet method is generally preferable to the dry method, since it does not damage the underlying substrate. However, in wet ashing methods the chemical bath that is needed to remove the resist can also contaminate the substrate. In addition, particles that remain in the chemical bath can re-adhere to the substrate. Thus, in the wet ashing method a cleaning step is required before the substrate is ready for the anneal process.

The dry ashing method typically includes exposing the substrate and the photo resist to a plasma. The plasma formation occurs at low pressure. Thus, the amount of reactive gas available to the removal process is low. For example, in an oxygen plasma that is formed at about 1 Torr, the amount of $O_2$ available to react with the photoresist is about 1000 times less than is available in air.

Unfortunately, substrate damage can occur as the substrate is exposed to the plasma due to the ion bombardment. In addition, dry ashing methods usually leave residue on the wafer surface even after the ashing processes are complete. As a result, the photoresist stripped wafer has to be reprocessed by wet cleaning before conducting an ion implant anneal or other process, which adds another level of complexity to the overall substrate processing.

What is needed, therefore, is an ashing method that reduces damage to the substrate, reduces the amount of residue and particle contaminates remaining on the stripped substrate and increases the throughput of the ashing process.

SUMMARY

The present invention provides a method for removing a resist from the surface of a substrate that reduces damage to the underlying substrate and reduces the amount of residue and particles remaining on the substrate after the resist removal process. The rate at which substrates are processed can be increased, since process steps typically associated with resist removal methods can be eliminated in the present invention.

In one example, after an ion implantation step, thermal ashing is conducted in a high oxygen concentrated environment. The environment may be maintained, for example, between about 1–100% $O_2$, at a pressure of between about 100 to about 760 Torr at low temperatures, for example, up to between about 700° C. and 1300° C., to remove the resist.

Since, for example, resist consists of Carbon (C), Hydrogen (H) and Oxygen (O); the products of reaction of the thermal oxidation of the resist include $CO_2$ and $H_2O$. The process of the present invention includes a substantial amount of oxygen to ensure that the resist is completely oxidized. The completeness of the oxidation is such that it leaves no residue or other contaminates to remain on the substrate.

In another example of the present invention, the thermal ashing process occurs after ion implantation and before metallization, thus, maintaining the processing temperature near 700° C. does not affect the substrate structure. Advantageously, conducting the thermal ashing at a temperature less than 700° C. does not affect redistribution or activation of the implanted species.

In yet another example of the invention, the thermal ashing process is conducted in a "one step" process. A substrate at ambient temperature is positioned in a processing chamber filled with pure oxygen, which has been preheated to implant annealing temperatures (e.g. up to about 1300° C.). Advantageously, as the substrate heats from ambient to the annealing temperature, the thermal ashing process commences. However, the thermal ashing process is complete before the substrate temperature reaches a steady-state temperature equivalent to the annealing temperature. Once the substrate reaches the annealing temperature, the implanted species is electrically activated.

In another example, the same thermal ashing process can be used after a metallization process at temperatures below the critical melting temperatures of the metals. For example, exposing a substrate and resist to a 100% oxygen rich environment at 400° C. at 760 Torr can remove a typical resist layer in about 30 minutes. However, the temperatures are low enough that the metal is not affected. Using thermal ashing after metallization while not using a plasma eliminates adverse affects caused because of the interaction of the metal and the plasma. Advantageously, since the cation and the electron typically included in a plasma ashing process are not employed, the wafer surface and other layers are not damaged.

In one aspect, an ashing method is provided including providing a substrate having a resist layer and implanted elements, and placing the substrate into a first processing chamber. The method also includes introducing substantially pure oxygen into the first processing chamber at a first partial pressure above 100 Torr, and varying the temperature of an internal environment of the first processing chamber to cause the oxygen to oxidize the resist layer to remove the resist layer from the substrate.

In another aspect, an ashing method is provided including introducing substantially pure oxygen into an internal environment of a first processing chamber to a first partial pressure; maintaining the internal environment of the first processing chamber at a first annealing temperature; and introducing a substrate having a first temperature and a resist layer formed thereon into the internal environment of the first processing chamber allowing the resist to be oxidized as the substrate heats from the first temperature to the annealing temperature.

In yet another aspect, an ashing method is provided including providing a substrate having a resist layer formed thereon and placing the substrate into an internal environment of a first processing chamber, introducing substantially pure oxygen into the internal environment of the first processing chamber at a first partial pressure of between 100 Torr and 1000 Torr; increasing a first temperature of the internal environment of the first processing chamber to a second temperature causing the substantially pure oxygen to react with the resist layer to oxidize the resist layer, and increasing the second temperature to a third temperature.

One advantageous aspect of the thermal ashing of the present invention is that wet cleaning process steps usually carried out between the conventional stripping and ion implantation annealing can be reduced or eliminated.

Since no plasma is created using the thermal ashing process of the present invention to remove the resist, ion damage to the substrate is eliminated.

These and other features and advantages of the present invention will be more readily apparent from the detailed description of the preferred embodiments set forth below taken in conjunction with the accompanying drawings.

DETAILED DESCRIPTION

Figure 1:
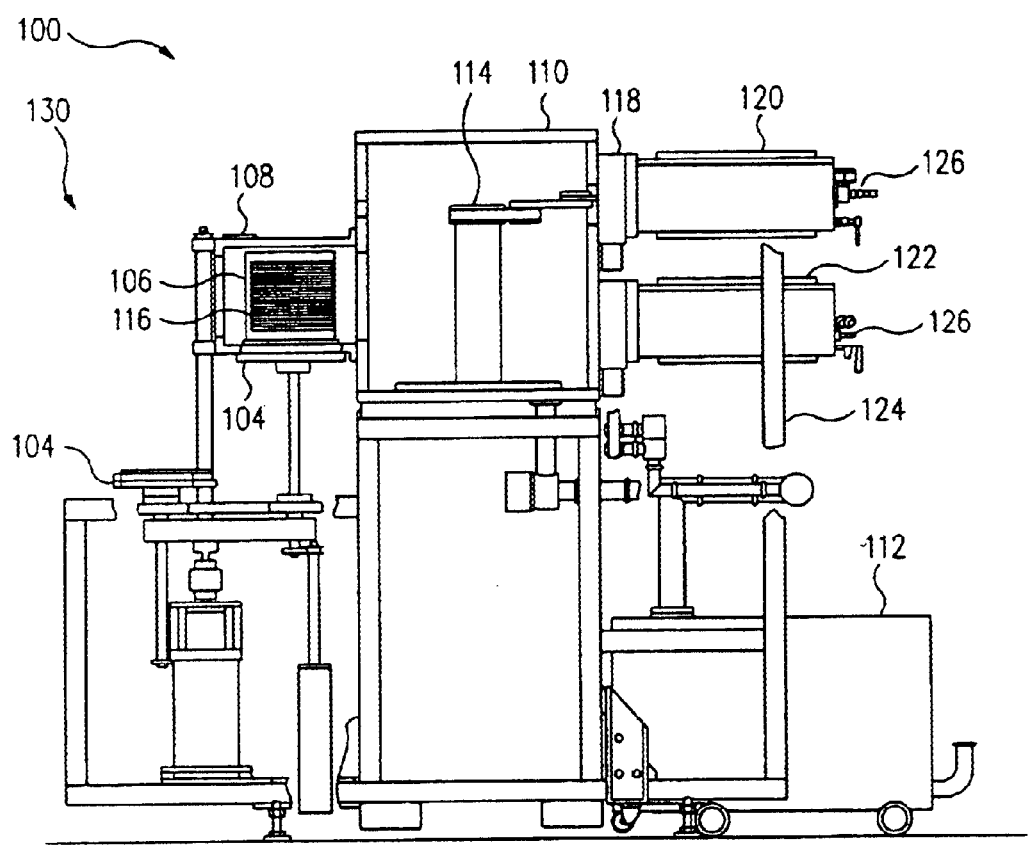
FIG. 1 is a schematic illustration of a side view of an embodiment of a semiconductor wafer processing system that establishes a representative environment of the present invention.

FIG. 1 is a schematic illustration of a side view of one embodiment of a semiconductor wafer processing system 100 that establishes a representative environment of the present invention. Processing system 100 includes a loading station 130 which has multiple platforms 104 for supporting and moving a wafer cassette 106 up and into a loadlock 108. Wafer cassette 106 may be a removable cassette which is loaded into a platform 104, either manually or with automated guided vehicles (AGV). Wafer cassette 106 may also be a fixed cassette, in which case wafers are loaded onto cassette 106 using conventional atmospheric robots or loaders (not shown). Once wafer cassette 106 is inside loadlock 108, loadlock 108 and transfer chamber 10 are maintained at atmospheric pressure or else are pumped down to vacuum pressure using a pump 112. A robot 114 within transfer chamber 110 rotates toward loadlock 108 and picks up a wafer 116 from cassette 106. A reactor or thermal processing chamber 120, which may also be at atmospheric pressure or under vacuum, accepts wafer 116 from robot 114 through a gate valve 118. Optionally, additional reactors may be added to the system, for example thermal processing chamber 122. Robot 114 then retracts and, subsequently, gate valve 118 closes to begin the processing of wafer 116. After wafer 116 is processed, gate valve 118 opens to allow robot 114 to remove and place wafer 116. Optionally, a cooling station (not shown) is provided, which allows the newly processed wafers, which may have temperatures upwards of 100° C., to cool before they are placed back into a wafer cassette in loadlock 108. A representative processing system is disclosed in U.S. Pat. No. 6,410,455, which is herein incorporated by reference for all purposes.

In accordance with the present invention, thermal processing chambers 120 and 122 can be single wafer rapid thermal furnace (SRTF) systems, such as those used in thermal anneals. In other embodiments, thermal processing chambers 120 and 122 can be other types of reactors, such as those used for dopant diffusion, thermal oxidation, nitridation, chemical vapor deposition, and similar processes.

Figure 2:
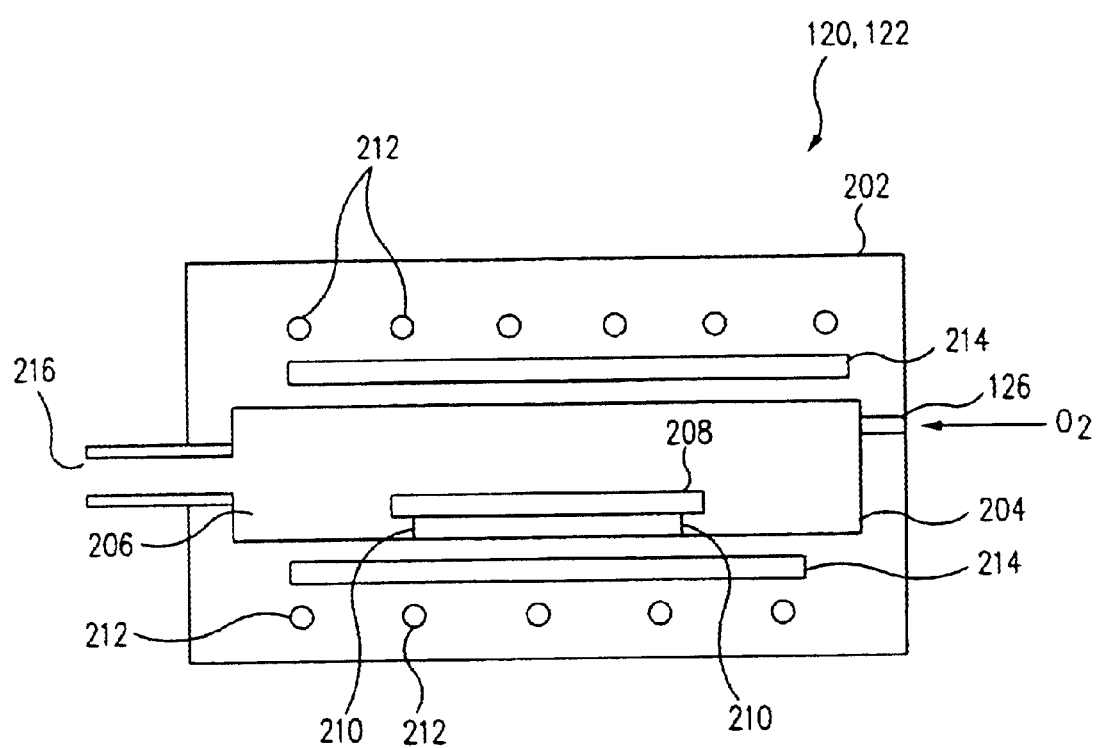
FIG. 2 is a simplified cross-sectional view of a thermal processing chamber in accordance with an embodiment of the present invention.

FIG. 2 is a simplified cross-sectional view of thermal processing chamber 120 (and 122) in accordance with an embodiment of the present invention. Externally, thermal processing chamber 120 may be a metallic shell 202 preferably made of aluminum or similar metal, defining an opening 204 configured to receive a wafer for processing.

Thermal processing chamber 120 includes a process tube 204, which defines an interior cavity 206 in which processing of wafer 208 can occur. In one embodiment, process tube 204 may be constructed with a substantially rectangular cross-section, having a minimal internal volume surrounding wafer 208. Process tube 204 can be made of quartz, but may be made of silicon carbide, $Al_2O_3$, or other suitable material. Process tube 204 can be capable of being pressurized with pressures between about 0.001 Torr to 1000 Torr, for example, between about 0.1 Torr and about 760 Torr.

Positioned within cavity 206 of process tube 204 are wafer support standoffs 210, which support the single wafer 208. Standoffs 210 may be any high temperature resistant material, such as quartz. In some embodiments, standoffs 210 may have a height of between about 50 $\mu$m and about 20 mm.

Process tube 204 includes inlet and exhaust ports 126 for receiving and expelling gases.

Referring again to FIG. 2, process tube 204 is substantially surrounded by heating elements 212. Heat diffusing members 214 can be positioned proximate to heating elements 212 so as to be between heating elements 212 and process tube 204. Heat diffusing members 214 absorb the thermal energy output from heating elements 212 and dissipate the heat evenly across process tube 204. Heat diffusing members 214 may be any suitable heat diffusing material that has a sufficiently high thermal conductivity, preferably silicon carbide, $Al_2O_3$, or graphite.

Opening 216 provides access for the loading and unloading of wafer 208 before and after processing. Opening 216 may be a relatively small opening. In one embodiment, opening 216 may have a height and width large enough to accommodate a wafer of between about 0.5 to 2 mm thick and up to about 300 mm (~12 in.) in diameter, and a portion of robot 106 (FIG. 1) passing therethrough. The height of opening 216 can be between about 18 mm and 50 mm, for example, no greater than about 20 mm. It should be understood that the size of process tube 204 and opening 216 can be made any size large enough to accommodate the processing of any sized wafer.

Figure 3:
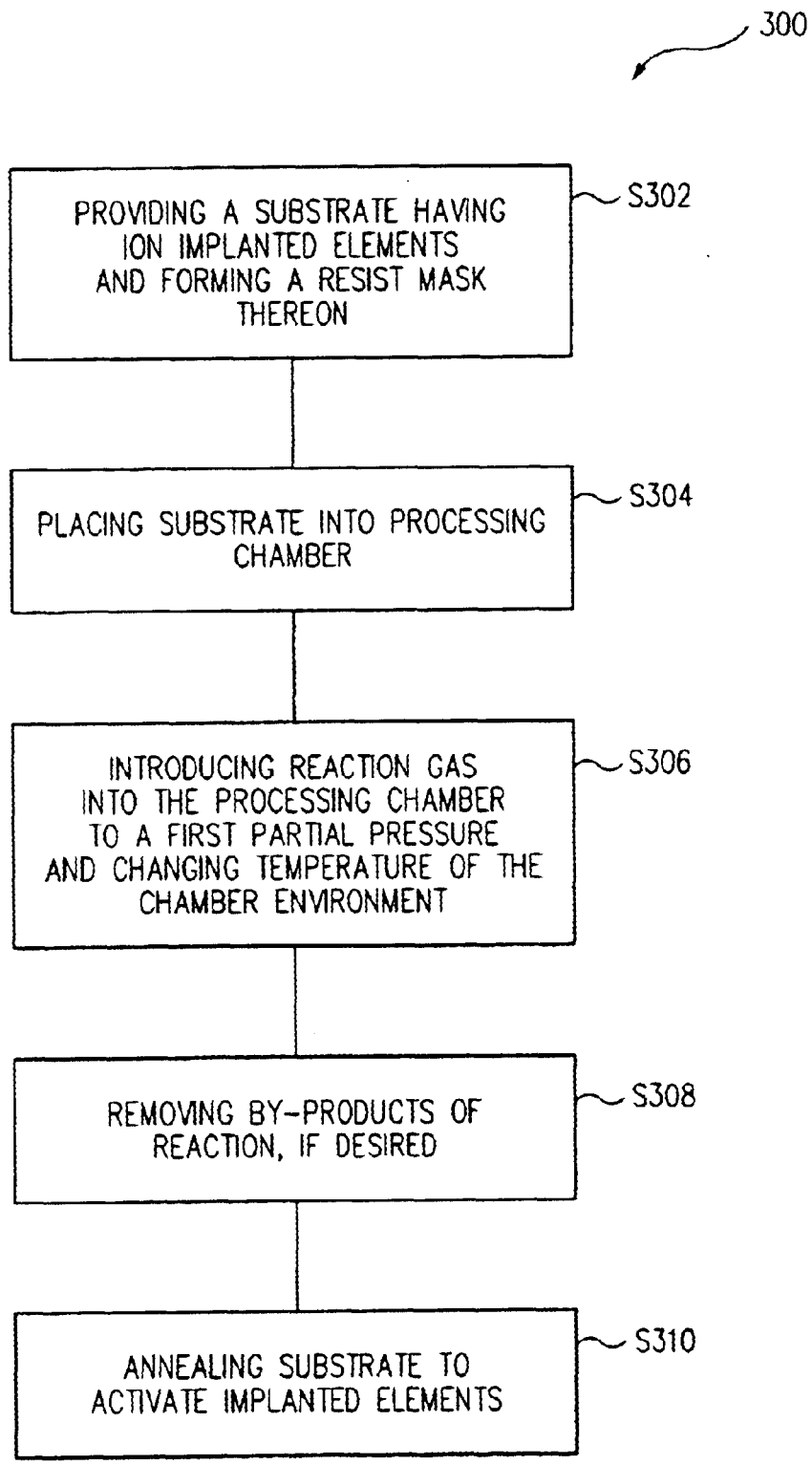
FIG. 3 is a flowchart of an embodiment of the process of the present invention.

FIG. 3 is a flowchart of the thermal ashing process (300) of the present invention.

In one embodiment, a silicon substrate or wafer is provided. In this embodiment, the wafer has undergone an ion implant process (s302). For example, a substrate having an N well and a P well formed thereon. The p-type impurity and n-type impurity are separately implanted while covering respective parts of the silicon substrate with the resist mask. While forming MOS transistors in the N well and the P well respectively, the p-type impurity and the n-type impurity are ion-implanted selectively into the N well and the P well. A resist mask is used to cover one of the N well and the P well, since different impurities are to be implanted into the N wells and the P wells, respectively. For example, n-type impurities may include phosphorus and arsenic, while p-type impurities may include boron.

Before being able to continue with the ion-implantation process, the resist is removed.

In one embodiment of the present invention, the resist removal process begins by loading wafer 208 into processing chamber 120 through the load/unload chamber 108 to be placed on wafer standoffs 210 (s304). Immediately after this placement, gate valve 118 is closed.

A reaction gas of up to substantially 100% pure $O_2$, is introduced into processing chamber 120 after the placement of wafer 208 in processing chamber 120 (s306). The partial pressure of the oxygen in processing chamber 120 is adjusted, for example, to between about 100 Torr and 1000 Torr, preferably about 760 Torr. In some embodiments, small amounts of cleaning gases and/or steam can be allowed to flow with the oxygen to facilitate the removal of the resist residue. The cleaning gases can include, for example, $CF_4$, $F_2$ and the like.

The temperature of the internal environment of processing chamber 120 is ramped up from ambient or, alternatively, from a pre-heated temperature to up to about 700° C. to about 1200° C.

Under these temperature and pressure conditions, $O_2$ reacts with the resist layer. Since the resist layer is made of carbon, hydrogen and oxygen, the oxidation of the resist layer yields $CO_2$ and $H_2O$. The high concentration of $O_2$ at the elevated temperatures ensures that the oxidation of the resist is complete, thus leaving no residual to remain on wafer 208. If necessary or desired, the remaining $O_2$, $CO_2$ and $H_2O$ are subsequently exhausted away (s308). In some embodiments, processing chamber 120 may be purged using, for example, nitrogen to remove all oxygen before commencing with annealing.

In one example, a substrate and resist held in processing chamber 120 at about 400° C. in a substantially 100% pure oxygen environment, the removal rate of photoresist can be made to be about 0.01 $\mu$m/min to about 5 $\mu$m/min.

Once the ashing process is complete, the temperature in processing chamber 122 is raised to an annealing temperature between, for example 700° C. and 1200° C. to activate the implanted species (s310). In one embodiment, the transition from the thermal ashing range of temperatures to the annealing temperature may be continuous.

Alternatively, wafer 208 can be removed from processing chamber 120 and placed in an annealing chamber, such as processing chamber 122 (FIG. 1). The temperature in processing chamber 122 is raised to an annealing temperature between, for example 700° C. and 1200° C. to activate the implanted species (s310). Advantageously, using two chambers to separately conduct the thermal ashing and annealing may increase the wafer throughput.

Figure 4:
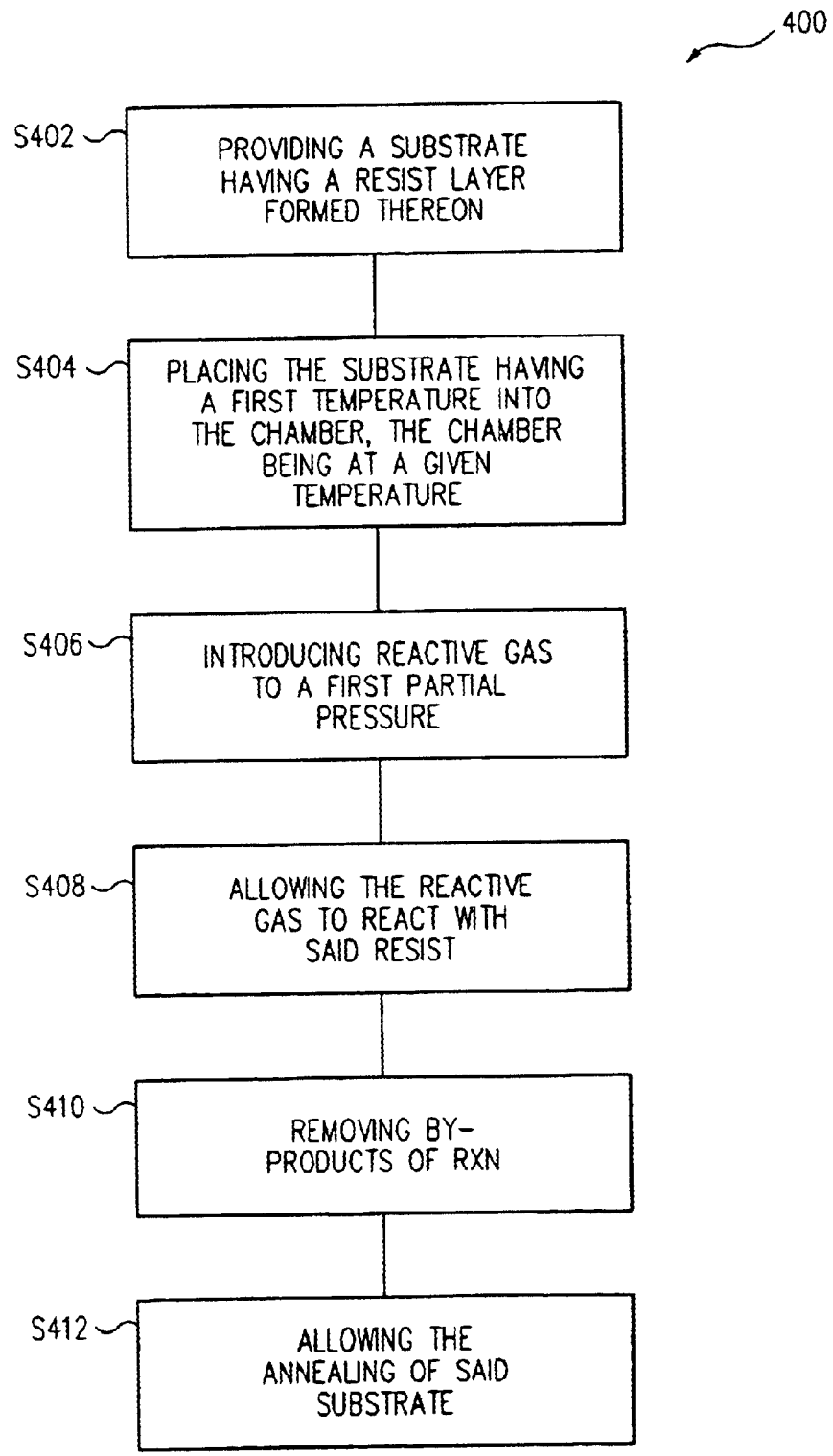
FIG. 4 is a flow chart illustrating yet another embodiment of the present invention

FIG. 4 is a flow chart illustrating yet another embodiment of the present invention. In this embodiment, thermal ashing process 400 of the present invention can be accomplished using a single processing chamber 120 in a so-called "one step" process. In this embodiment, wafer 208 having a resist formed thereon is loaded in to processing chamber 120 (s402). The temperature of wafer 208 is at an ambient temperature (or at a temperature well below the present temperature of the processing chamber). The temperature of the internal environment of processing chamber 120 is maintained at a given processing temperature suitable for annealing, such as between about 900° C. and about 1200' C.

The reaction gas of substantially pure oxygen is introduced (s406) into processing chamber 120, thus exposing wafer 208 and the resist to the oxygen and initiating the oxidation of the resist.

As wafer 208 heats from its ambient temperature to the annealing temperature of the processing chamber environment, the resist is oxidized, forming $CO_2$ and $H_2O$ (s408). The resulting by-products of the reaction, $CO_2$ and $H_2O$, as well as any remaining $O_2$, can then be removed, if desired, from processing chamber 120 (s410).

As wafer 208 continues to heat towards a steady-state annealing temperature, the resist stripped wafer undergoes an implant anneal to activate the implanted impurities (s412).

The thermal ashing process of the present invention removes the resist without using a plasma and at temperatures below the critical temperature at which aluminum structures are compromised. Thus, the thermal ashing process of the present invention can be used to remove resist even in the presence of Al or other similar types of metals.

The thermal ashing process of the present invention has been described above as typically preceding an implant anneal. However, it should be understood by those of ordinary skill in the art that the thermal ashing process of the present invention, can be used to remove a resist layer prior to or proceeding most semiconductor manufacturing processes, such as diffusion, oxidation and deposition processes.

Having thus described embodiments of the present invention, persons skilled in the art will recognize that changes may be made in form and detail without departing from the scope of the invention. For example, the ashing and implant anneal process of the present invention can be accomplished in a batch wafer processing system to increase the throughput of wafers. Thus the invention is limited only by the following claims.

What is claimed is:

1. An ashing method comprising:

providing a substrate having a resist layer and implanted elements, and placing said substrate into a first processing chamber, introducing substantially pure oxygen into said first processing chamber at a first partial pressure above 100 Torr, and varying the temperature of an internal environment of said first processing chamber to a temperature up to between about 700° C. and 1300° C. cause said oxygen to oxidize said resist layer to remove said resist layer from said substrate.

2. The method of claim 1, wherein introducing substantially pure oxygen into said first processing chamber at said first partial pressure comprises introducing substantially pure oxygen into said first processing chamber at a first partial pressure of 760 Torr.

3. The method of claim 1, wherein introducing substantially pure oxygen into said first processing chamber at said first partial pressure comprises introducing said oxygen at a first partial pressure of about 760 Torr; and wherein varying the temperature of said internal environment of said first processing chamber comprises increasing the temperature of said internal environment to a temperature up to about 700° C.

4. The method of claim 3, wherein varying the temperature of said internal environment of said first processing chamber comprises increasing the temperature of said internal environment from a temperature of up to about 700° C. to a temperature up to about 1300° C.

5. The method of claim 1, further comprising:

annealing said substrate in a second processing chamber to activate said implanted elements.

6. The method of claim 5, wherein said first processing chamber and said second processing chamber ate the same chamber.

7. The method of claim 1, wherein said oxidation of said resist layer to remove said resist layer from said substrate yields $CO_2$ and $H_2O$.

8. The method of claim 1, wherein said first sing chamber is configured to hold a plurality of substrates.

9. The method of claim 1, further comprising introducing cleaning gases and steam, together or separately, into said first processing chamber to facilitate the removal of resist residue.

10. An ashing method comprising:
   introducing substantially pure oxygen into an internal environment of a first processing chamber to a first partial pressure;
   maintaining said internal environment of said first processing chamber at a first annealing temperature, wherein said annealing temperature ranges from between about 700° C. and 1300° C.; and
   introducing a substrate having a first temperature and a resist layer formed thereon into said internal environment of said first processing chamber allowing said resist to be oxidized as said substrate heats from said first temperature to said annealing temperature.

11. The method of claim 10, wherein said first partial pressure is between about 100 Torr and 760 Torr.

12. The method of claim 10, wherein said first temperature is an ambient temperature.

13. The method of claim 10, further comprising allowing said substrate to heat to said annealing temperature causing said substrate to be annealed.

14. The method of claim 10, further comprising introducing cleaning gases and steam, together or separately, into said first processing chamber to facilitate the removal of resist residue.

15. The method of claim 10, wherein said introducing a substrate having a first temperature and a resist layer formed thereon into said internal environment of said first processing chamber comprises introducing a plurality of substrates having a first temperature and a resist layer formed thereon into said internal environment of said first processing chamber.

16. An ashing method comprising:
   providing a substrate having a resist layer formed thereon and placing said substrate into an internal environment of a first processing chamber;
   introducing substantially pure oxygen into said internal environment of said first processing chamber at a first partial pressure of between 100 Torr and 1000 Torr;
   increasing a first temperature of said internal environment of said first processing chamber to a second temperature up to between about 700° C. and 1300° C. causing said substantially pure oxygen to react with said resist layer to oxidize said resist layer; and
   increasing said second temperature to a third temperature.

17. The method of claim 16, wherein said third temperature is greater than said second temperature.

18. The method of claim 16, wherein said increasing said first temperature to a second temperature and said increasing said second temperature to said third temperature comprises a gradually continuous process.

* * * * *

UNITED STATES PATENT AND TRADEMARK OFFICE
CERTIFICATE OF CORRECTION

PATENT NO. : 6,897,162 B2  
APPLICATION NO. : 10/690315  
DATED : May 24, 2005  
INVENTOR(S) : Woo Sik Yoo

Page 1 of 1

It is certified that error appears in the above-identified patent and that said Letters Patent is hereby corrected as shown below:

Column 7, line 2 delete "ate" and insert --are--

Column 7, line 7 delete "sing" and insert --processing--

Signed and Sealed this

Tenth Day of October, 2006

JON W. DUDAS  
*Director of the United States Patent and Trademark Office*